(12) United States Patent
Lau et al.

(10) Patent No.: US 7,259,445 B2
(45) Date of Patent: Aug. 21, 2007

(54) THERMAL ENHANCED PACKAGE FOR BLOCK MOLD ASSEMBLY

(75) Inventors: Daniel K. Lau, San Francisco, CA (US); Edward L. T. Law, Chandler, AZ (US)

(73) Assignee: Advanced Interconnect Technologies Limited, Port Louis (MU)

( * ) Notice: Subject to any disclaimer, the term of this patent is extended or adjusted under 35 U.S.C. 154(b) by 0 days.

(21) Appl. No.: 10/529,017

(22) PCT Filed: Sep. 23, 2003

(86) PCT No.: PCT/US03/29569

§ 371 (c)(1),
(2), (4) Date: Sep. 22, 2005

(87) PCT Pub. No.: WO2004/032186

PCT Pub. Date: Apr. 15, 2004

(65) Prior Publication Data

US 2006/0166397 A1 Jul. 27, 2006

Related U.S. Application Data

(60) Provisional application No. 60/415,189, filed on Sep. 30, 2002.

(51) Int. Cl.
*H01L 23/495* (2006.01)
(52) U.S. Cl. ....................... 257/675; 438/106
(58) Field of Classification Search ................ 257/675, 257/706, 707, 783, 787; 438/106, 122, 124, 438/126, 127
See application file for complete search history.

(56) References Cited

U.S. PATENT DOCUMENTS

| 5,367,196 A | | 11/1994 | Mahulikar et al. |
| 5,483,740 A | * | 1/1996 | Maslakow ................... 29/827 |
| 5,608,267 A | | 3/1997 | Mahulikar et al. |
| 5,650,663 A | | 7/1997 | Parthasarathi |
| 5,734,201 A | * | 3/1998 | Djennas et al. ............. 257/783 |

(Continued)

*Primary Examiner*—Phuc T. Dang
(74) *Attorney, Agent, or Firm*—Gregory S. Rosenblatt; Wiggin and Dana LLP

(57) ABSTRACT

A heat spreader (20) is added to a package to enhance thermal and advantageously electrical performance. In manufacture, a heat spreader precursor (24) is advantageously placed over a group of dies and secured after bonding (e.g., wire or tape bonding or flip-chip bonding) and before matrix/block mold. For example, a package strip (10) may consist of a row (linear array) of groups of die attach areas (e.g. in a rectangular array of four). The heat spreader precursor (20) may accommodate one such group or multiple groups along the package strip (10). The package strip (10) may then be singulated to form the individual packages. Each singulated package includes a die (14), its associated substrate 16 (e.g., either a lead frame or interposer type substrate) and a portion of the heat spreader precursor (24) as a heat spreader (20).

13 Claims, 11 Drawing Sheets

U.S. PATENT DOCUMENTS

| | | |
|---|---|---|
| 5,905,632 A | 5/1999 | Seto et al. |
| 5,919,329 A | 7/1999 | Banks et al. |
| 5,929,513 A * | 7/1999 | Asano et al. ............... 257/675 |
| 5,970,319 A | 10/1999 | Banks et al. |
| 5,977,626 A | 11/1999 | Wang et al. |
| 6,057,601 A | 5/2000 | Lau et al. |
| 6,271,579 B1 * | 8/2001 | Going et al. ................ 257/664 |
| 6,359,341 B1 | 3/2002 | Huang et al. |
| 6,409,859 B1 | 6/2002 | Chung |
| 6,432,742 B1 | 8/2002 | Guan et al. |
| 6,432,749 B1 | 8/2002 | Libres |
| 6,432,752 B1 | 8/2002 | Farnworth |
| 6,534,859 B1 * | 3/2003 | Shim et al. ................. 257/706 |

* cited by examiner

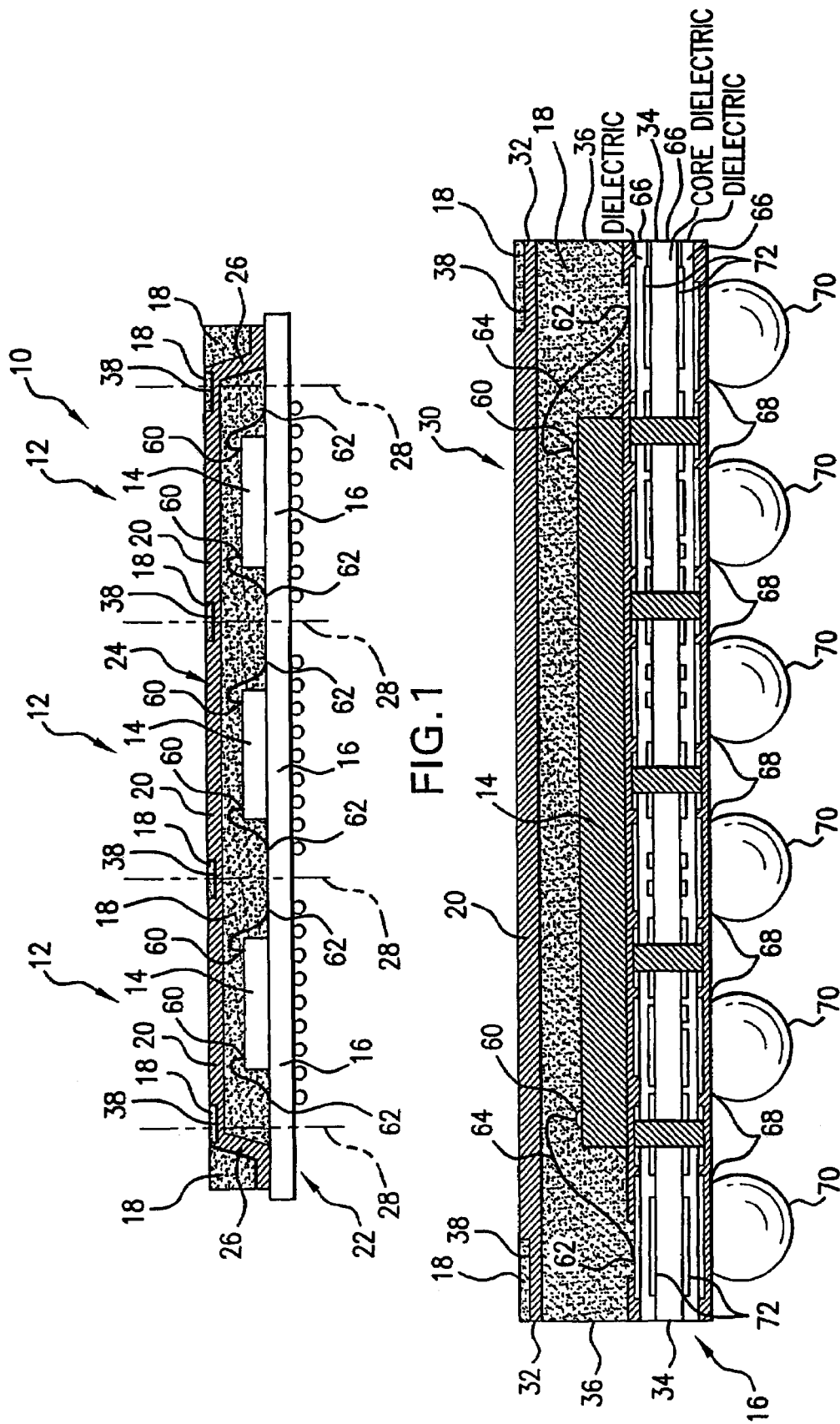

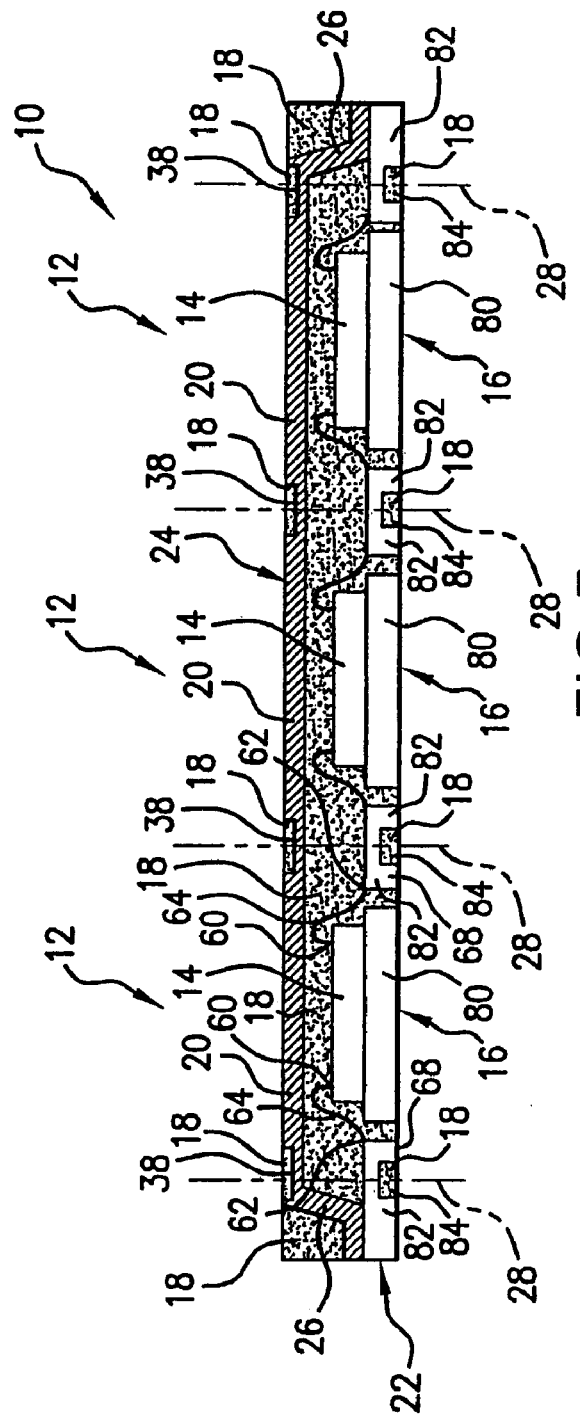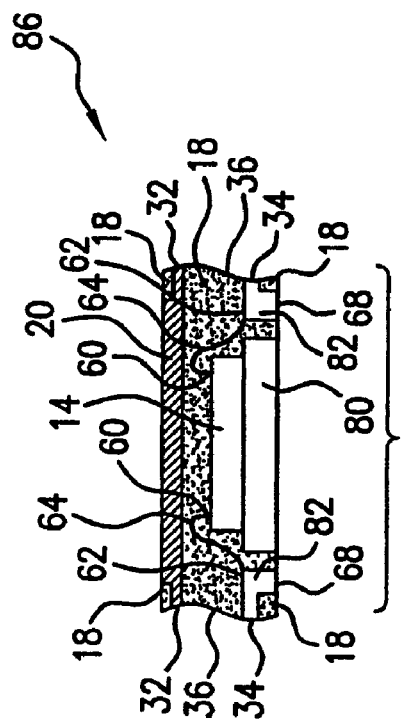

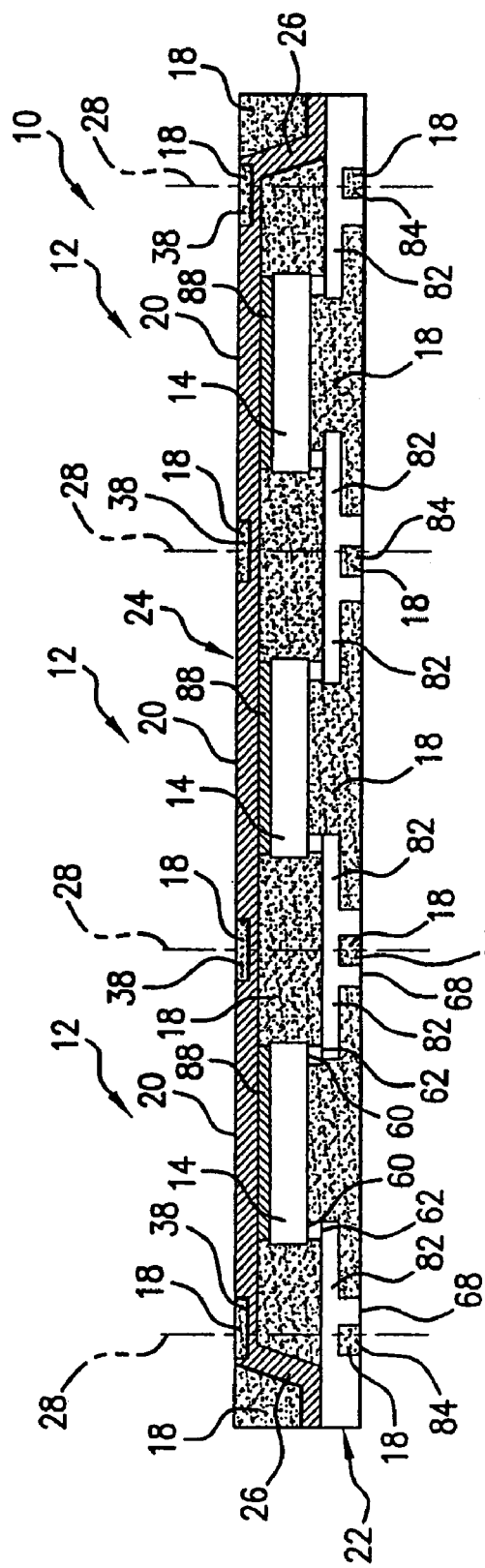
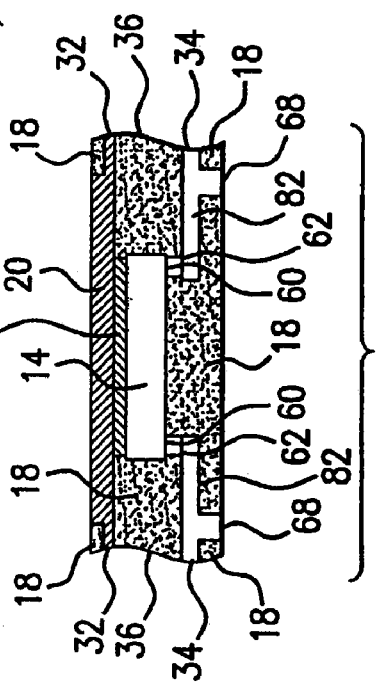
FIG.7b
FIG.8b

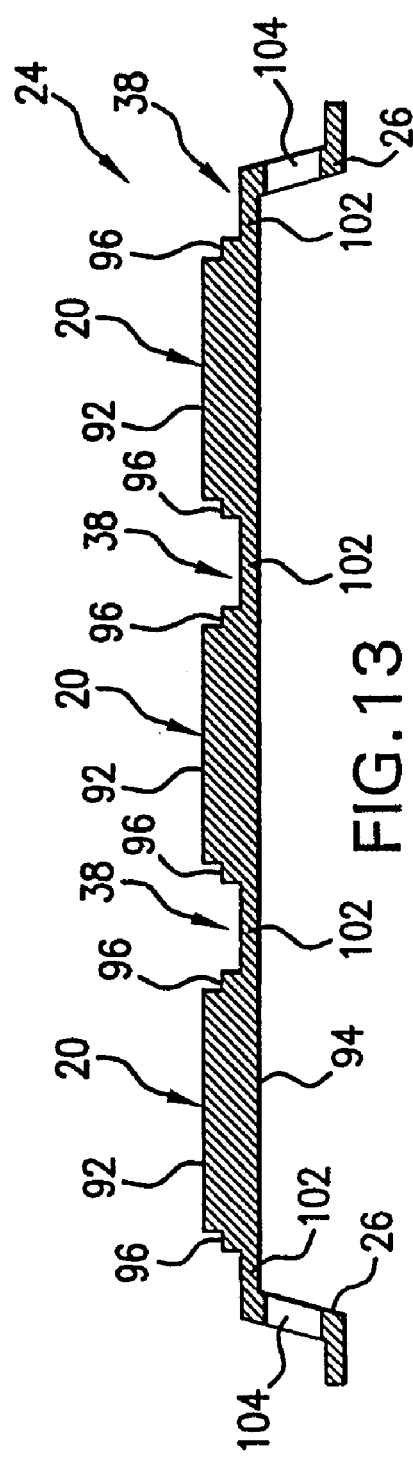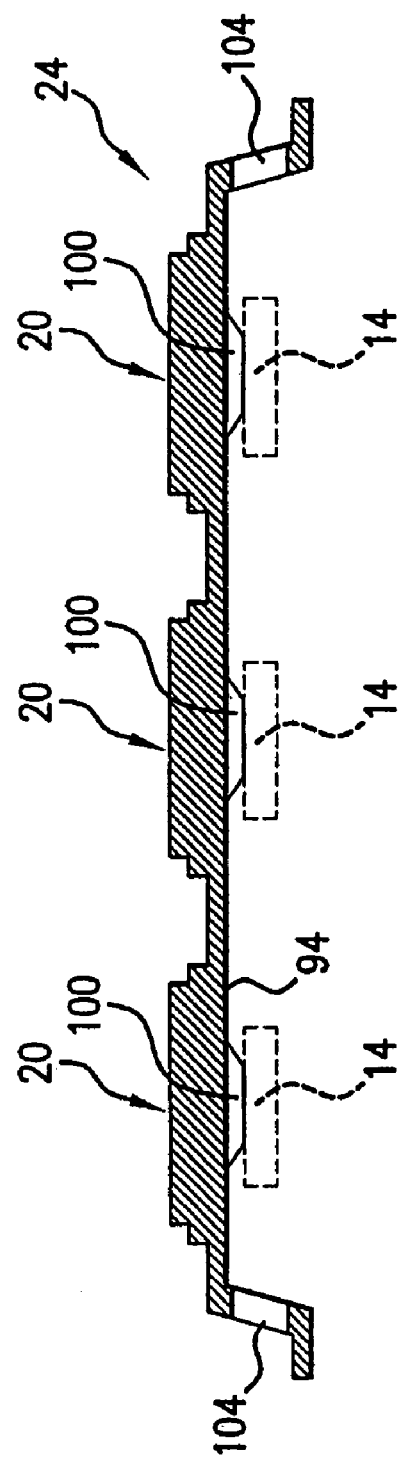

THERMAL ENHANCED PACKAGE FOR BLOCK MOLD ASSEMBLY

CROSS REFERENCE TO RELATED APPLICATION

This application is a 371 of PCT/US03/29569 filed Sep. 23, 2003 which claims the benefit of U.S. Provisional Patent Application No. 60/415,189 filed on Sep. 30, 2002, which is incorporated by reference herein in its entirety.

BACKGROUND OF THE INVENTION

1. Field of the Invention

This invention relates to semiconductor device packages. More particularly, this invention relates to thermally enhanced, molded plastic semiconductor device packages.

2. Description of the Related Art

Molded plastic packages provide environmental protection to integrated circuit devices (dies). Such packages typically include at least one semiconductor device (die) having its input/output (I/O) pads electrically connected to a lead frame type substrate or an interposer type substrate, with a molding compound coating the die and at least a portion of the substrate. Typically, the I/O pads on the die are electrically connected to bond sites on the substrate using either a wire bonding, tape bonding, or flip-chip bonding method. The lead frame or interposer substrate transmits electrical signals between the I/O pads and an electrical circuit external to the package.

In semiconductor device packages having a lead frame type substrate, electrical signals are transmitted between at least one die and external circuitry, such as a printed circuit board, by an electrically conductive lead frame. The lead frame includes a plurality of leads, each having an inner lead end and an opposing outer lead end. The inner lead end is electrically connected to the I/O pads on the die, and the outer lead end provides a terminal for connecting to the external circuitry. Where the outer lead end terminates at a face of the package body, the package is known as a "no-lead" or "leadless" package. Examples of well-known no-lead packages include quad flat no-lead (QFN) packages, which have four sets of leads disposed around the perimeter of the bottom of a square package body, and dual flat no-lead (DFN) packages, which have two sets of leads disposed along opposite sides of the bottom of a package body.

In semiconductor device packages having an interposer type substrate, electrical signals are transmitted between at least one die and external circuitry, such as a printed circuit board, by a substrate comprising multiple layers, usually 2 or 3 thin layers, of dielectric material having electrical traces, pins, vias, and the like formed thereon. This type of substrate is typically used in grid array packages, such as ball grid array (BGA) packages, pin grid array (PGA) packages, land grid array (LGA) packages, fine ball grid array (FBGA) packages, flexible ball grid array (FxBGA) packages, and any other type of package that requires lands on the package to be arranged at a suitable circuit board-attach pitch (a "grid array"). Solder balls, bumps or pins may be disposed on the lands, as in BGA and PGA type packages, to facilitate connection to the circuit board.

In any type of molded plastic package, operation of the die generates heat that must be removed to maintain its operating integrity. While some heat is dissipated through the metallic components of the package, such as portions of the substrate and bond wires, the remainder is absorbed into the molding compound. Problematically, the molding compound is a poor thermal conductor. As a result, attempts have been made to improve the thermal dissipation performance of the molded plastic package.

One way to increase thermal dissipation performance of a molded plastic package is to dispose a metallic heat spreader within the package. In one common design, the metallic heat spreader is placed below the die. Examples of such heat spreader designs are provided, for example, in U.S. Pat. Nos. 5,367,196 and 5,608,267, both to Mahulikar et al., and in U.S. Pat. No. 5,650,663 to Parihasarathi, all of which are incorporated by reference herein in their entirety.

In another common design, the metallic heat spreader is spaced above the die, such that the die is positioned between the heat spreader and the substrate. In this design, the heat spreader typically includes downwardly directed portions that contact the substrate, the die, or both. The downwardly directed portions may be adhered to the substrate and/or die using a dielectric adhesive. Such heat spreaders typically act to spread the heat throughout the encapsulant over an area larger than that of the chip. One example of such a heat spreader is provided in U.S. Pat. No. 6,432,742 to Guan et al. Another example of such a heat spreader is provided in U.S. Pat. No. 5,977,626 to Wang et al. Unfortunately, manufacturing methods for packages employing this type of heat spreader have not lent themselves to the high level of automation needed for assembly of lower cost molded plastic packages.

One attempt to automate the assembly of molded plastic packages with heat spreaders is provided in U.S. Pat. No. 6,432,749 to Libres (the '749 patent), which is incorporated by reference herein in its entirety. The '749 patent describes a method of manufacture in which heat spreaders are provided in strip format to allow a plurality of packages to be assembled at the same time. The strip of heat spreaders is placed over the die and substrate, and a molding compound is disposed over the heat spreader, die, and substrate such that the edge of the encapsulating material is coincident with a reduced cross-sectional pillar connecting an adjacent heat spreader. The reduced cross-sectional pillar is then cut to separate the packages. Where the substrate is a leadframe, the '749 patent teaches adhering the heat spreader to the leadframe using a non-conductive adhesive to prevent electrical shorting. While this method provides for automated assembly, the assembly requires that the packages be individually molded (i.e., pocket molded) to reveal the cross-sectional pillar so that it may be cut. The use of individual molds for each package is undesirable for certain applications because it makes the molding process prone to manufacturing defects such as misalignment of the individual molds relative to the die and substrate. In addition, the method described in the '749 patent requires the use of non-conductive adhesive to secure the heat spreader to the leadframe to prevent electrical short circuits. This is another step in the manufacturing process where defects can occur.

There remains, therefore, a need for a method for the automated manufacture of thermal enhanced molded plastic packages that does not require complex manufacturing steps.

BRIEF SUMMARY OF THE INVENTION

The above-described and other drawbacks and deficiencies of the prior art are overcome or alleviated by a device comprising: a substrate having first and second generally opposite surfaces, the substrate first surface having a plurality of bond sites disposed thereon; a die having first and second generally opposite surfaces parallel to the substrate first and second surfaces, the die first surface having a plurality of I/O pads disposed thereon, the I/O pads being electrically connected to the bond sites; a molding compound encapsulating the die and at least the first surface of the substrate; and a heat spreader at least partially embedded in the molding compound. The heat spreader has a peripheral cut edge portion aligned with and not recessed from associated peripheral cut edge portions of the substrate and molding compound.

The substrate may be a metallic lead frame, or may comprise a dielectric material having first electrical conductors disposed thereon, with the first electrical conductors being selected from at least one of electrically conductive traces, layers, vias, pins, and combinations including one or more of the foregoing. An array of second electrical conductors may electrically couple the substrate to an external circuit, with the second electrical conductors being selected from at least one of solder balls, solder bumps, solder paste, pins, and combinations including one or more of the foregoing. The I/O pads on the die may be electrically connected to the bond sites on the substrate using wire bonding, tape bonding, or flip-chip methods.

In one embodiment, heat spreader has first and second generally opposite surfaces parallel to the die first and second surfaces. The heat spreader second surface is covered by the molding compound, and the heat spreader first surface is uncovered by the molding compound. The heat spreader may include a protrusion extending from the heat spreader second surface, with the protrusion contacting the die. In another embodiment, the heat spreader includes a down-set leg contacting the substrate first surface. The heat spreader may be electrically connected to the substrate. Alternatively, the heat spreader is entirely separated from the substrate.

In another aspect of the invention, a method for manufacturing packaged semiconductor devices includes: disposing a plurality of dies onto a plurality of interconnected substrates; electrically connecting I/O pads on each die in the plurality of dies to bond sites on an associated substrate in the plurality of interconnected substrates; securing a plurality of interconnected heat spreaders over the plurality of dies; overmolding the plurality of dies, the bond sites, and the plurality of interconnected heat spreaders with a continuous coating of molding compound to form a plurality of interconnected package precursors; and singulating the interconnected package precursors to provide a plurality of packages.

In one embodiment, the plurality of interconnected heat spreaders includes a downset portion disposed at a perimeter of the plurality of interconnected heat spreaders. Securing the plurality of interconnected heat spreaders over the plurality of dies includes disposing the downset portion on the plurality of interconnected substrates, and the singulating includes singulating through the downset portion to provide a package having a heat spreader entirely separated from the substrate.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

The invention will be more fully understood from the following detailed description taken in conjunction with the accompanying drawings wherein like elements are numbered alike, and in which:

FIG. 1 is a cross-sectional elevation view of an exemplary package strip of the present invention having an interposer substrate;

FIG. 2 is a cross-sectional elevation view of a package singulated from the strip of FIG. 1;

FIG. 5 is a cross-sectional elevation view of an exemplary package strip of the present invention having a lead frame substrate;

FIG. 6 is a cross-sectional elevation view of a package singulated from the strip of FIG. 5;

FIG. 7b is a cross-sectional elevation view of the package strip of FIG. 7a having a thermally conductive material disposed between the dies and the heat spreader precursor;

FIG. 8a is a cross-sectional elevation view of a package singulated from the strip of FIG. 7a;

FIG. 8b is a cross-sectional elevation view of a package singulated from the strip of FIG. 7b;

FIG. 13 is a cross-sectional elevation view of the array of interconnected heat spreaders taken along section B-B of FIG. 12;

FIG. 14 is a cross-sectional elevation view of the array of interconnected heat spreaders taken along section B-B of FIG. 12 including a die contact protrusion;

DETAILED DESCRIPTION

Figure 3:
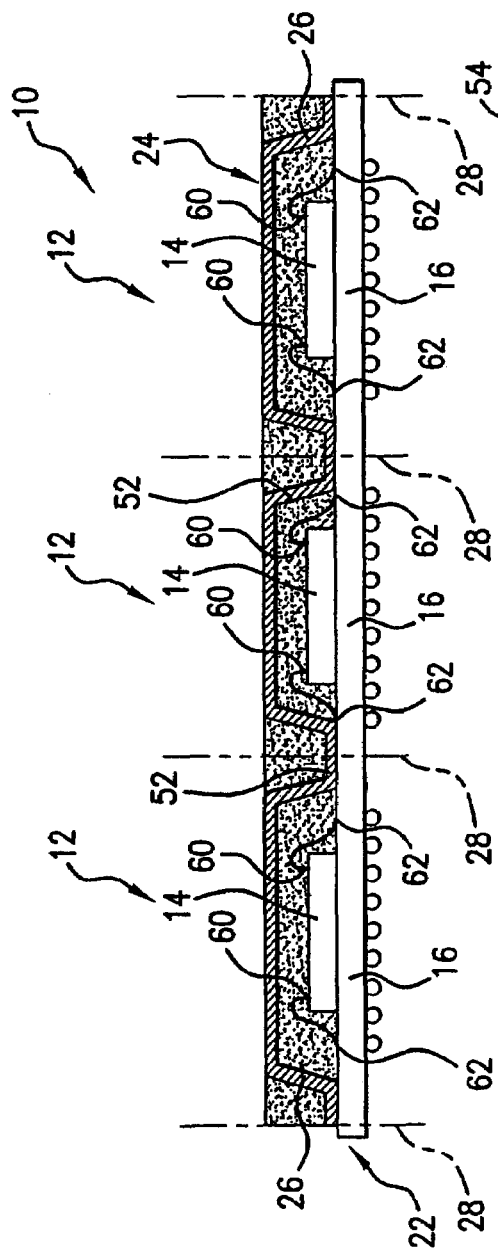
FIG. 3 is a cross-sectional elevation view of an alternative embodiment of a package strip having an interposer substrate.

Referring to FIG. 1, a cross-sectional elevation view of a package strip, shown generally at 10, includes three interconnected package precursors 12, each of which includes a die 14 electrically connected to a substrate 16 and coated with a molding compound 18. Disposed above the die 14 and partially encapsulated in the molding compound 18 of each package precursor 12 is a heat spreader 20. The substrates 16 are interconnected to form part of a substrate strip 22, and the heat spreaders 20 are interconnected to form part of a heat spreader precursor 24. The heat spreader precursor 24 includes down-set leg portions 26 that are coupled to edges of the substrate strip 22.

In the manufacture of package strip 10, the heat spreader precursor 24 is placed over the dies 14 after the dies 14 have been electrically connected to the substrate strip 22 and before the molding compound 18 is applied to the heat spreader precursor 24, the dies 14, and a portion of the substrate strip 22. The molding compound 18 is advantageously applied to the strip 10 using a block mold, where a continuous coating of molding compound 18 overmolds each package precursor 12 in the package strip 10. After the molding compound 18 is cured, the package strip 10 is then cut along lines 28, such as by blade saw, punch, laser, water jet, etc., to singulate the package precursors 12 into individual packages, one of which is shown generally as 30 in FIG. 2.

As shown in FIG. 2, each singulated package 30 includes a die 14 electrically connected to a portion of the substrate strip 22 (FIG. 1), which forms the substrate 16 for the package 30, and a portion of the heat spreader precursor 24 (FIG. 1), which forms the heat spreader 20 for the package 30. The heat spreader 20 is at least partially embedded in the molding compound 18 and has a peripheral cut edge portion 32 aligned with and not recessed from associated peripheral cut edge portions 34 and 36 of the substrate 16 and molding compound 18, respectively. The heat spreader 20 enhances the thermal and advantageously electrical performance of the package 30. In addition, the heat spreader 20 shields the die 14 from electromagnetic forces acting on the package 30.

Referring again to FIG. 1, the heat spreader precursor 24 may include reduced thickness notch areas 38 disposed at sides of the package precursors 12. The reduced thickness notch areas 38 ease singulation of the package precursors 12 by reducing the thickness of the heat spreader precursor 24 that must be cut during singulation. After singulation, the notch areas 38 form part of a shoulder that remains embedded in the molding compound 18, as seen in FIG. 2. The molding compound 18 acts on the shoulder to anchor the heat spreader 20 within the molding compound 18.

The down-set legs 26 support each of the interconnected heat spreaders 20 above the dies 14 in the substrate strip 10. Singulation of the package precursors 12 removes the legs 26, and results in a package 30 having a heat spreader 20 that is entirely separated from the substrate 16. Because the heat spreader 20 is entirely separated from the substrate 16, electrical isolation of the heat spreader 20 and the substrate 16 is ensured without the need for non-conductive adhesive, as is used with heat spreader designs of the prior art.

While in many package designs it is advantageous for the heat spreader 20 to be electrically isolated from the substrate 16, in other applications it is desirable to provide an electrical connection between the heat spreader 20 and substrate 16. For example, it may be desired to electrically ground the heat spreader 20 by electrically attaching the heat spreader 20 to a bond site on the substrate 16 associated with electrical ground. For use in such applications, an alternative to the heat spreader precursor 24 may be used, as shown in FIG. 3.

In the embodiment of FIG. 3, a heat spreader precursor 24 includes down-set legs 52 positioned between each of the package precursors 12 in addition to the legs 26 disposed at the perimeter of the heat spreader precursor 24. As shown by lines 28, singulation of the package precursors 12 occurs at the portion of legs 52 contacting the substrate strip 22 and, as a result, portions of the legs 52 remain attached to each substrate 16 after singulation.

Figure 4:
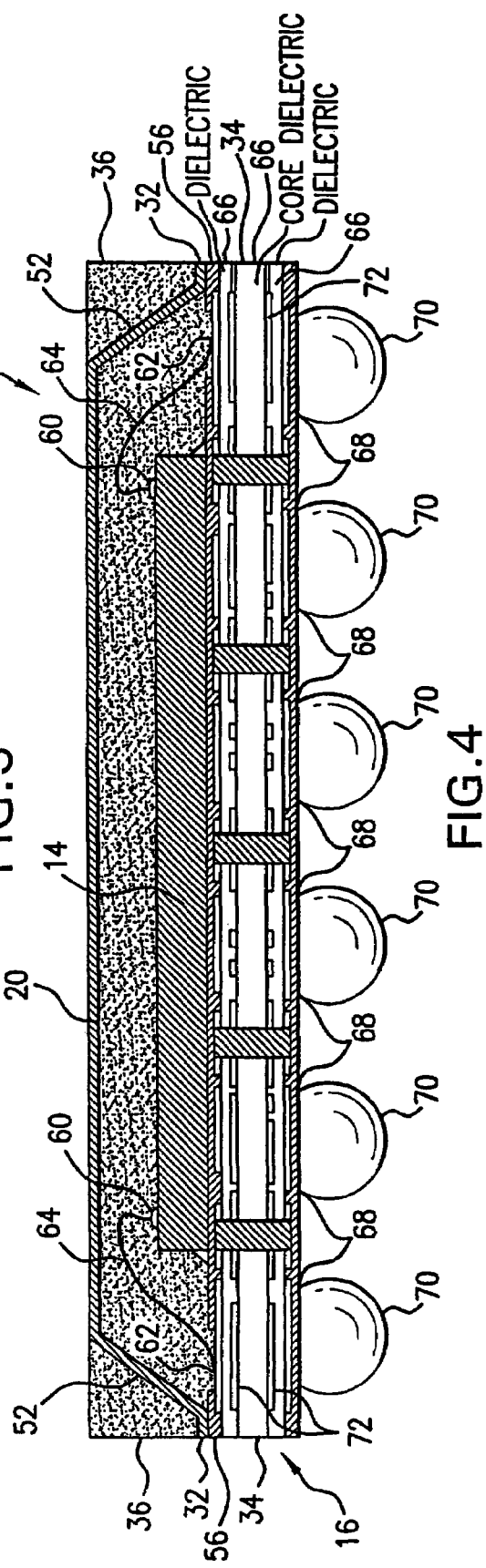
FIG. 4 is a cross-sectional elevation view of a package singulated from the strip of FIG. 3.

FIG. 4 depicts a cross sectional view of one package 54 singulated from the package strip 10 of FIG. 3. As seen in FIG. 4, each of the legs 52 is adhered to a pad 56 formed on the substrate 16 to form an electrical connection therebetween. Preferably, the leg 52 is adhered to the pad 56 with an epoxy adhesive.

In the embodiments of FIGS. 1-4, electrical connection between each input/output (I/O) pad 60 on the die 14 and an associated bond site 62 on the substrate 16 is accomplished by wire bonding or tape bonding, wherein one end of a wire 64 or conductive tape (not shown) is connected to the I/O pad 60 and an opposite end of the wire 64 is connected to the bond site 62. It will be appreciated, however, that the electrical connection between the I/O pads 60 on the die 14 and the bond sites 62 on the substrate 16 may alternatively be accomplished by a flip-chiptype connection, wherein the die 14 is flipped such that its I/O pads 60 can be directly electrically connected to the bond sites 62. By "directly" electrically connected it is meant that the interconnection is by a flip chip method without the use of an intervening wire bond or tape bonding tape. Suitable attachments include solders with a primary constituent selected from the group consisting of gold, tin, and lead.

In the embodiment of FIGS. 1-4, the substrates 16 are depicted as being of the interposer type of substrate, which comprises multiple layers, shown as 3 thin layers 66, of dielectric material having electrical conductors 72 (e.g., traces, pins, vias, and the like) formed thereon. The electrical conductors 72 terminate at lands 68, which are exposed at the surface of the package 30 or 34. Additional electrical conductors 70 such as solder balls, solder bumps, solder paste, pins, and the like may be attached to the lands 68. Electrical signals are transmitted between the I/O pads 60 on the die 14 and external circuitry, such as a printed circuit board, by the wires 64, electrical conductors 72, lands 68, and electrical conductors 70. It will be appreciated that, while the present invention is applicable to molded plastic packages having an interposer substrate, the present invention is equally applicable to molded plastic packages having other types of substrates. For example, FIGS. 5-8 depict molded plastic packages having lead frame type substrates.

Referring to FIG. 5, a cross-sectional elevation view of a package strip 10 having a metallic lead frame type substrate strip 22 includes three interconnected package precursors 12, each of which includes a die 14 electrically connected to the substrate 16 and coated with the molding compound 18. The substrate strip 22 includes a plurality of interconnected substrates 16 in the form of lead frames. The lead frames type substrate 16 are formed from a metallic material, such as copper or copper alloy. Each substrate 16 includes a die pad 80, to which the die 14 is adhered, and a plurality of leads 28 spaced apart from the die pad 80. Disposed above the die 14 and partially encapsulated in the molding compound 18 of each package precursor 12 is the heat spreader 20, which is interconnected with adjacent heat spreaders 20 to form the heat spreader precursor 24. The heat spreader precursor 24 used in the embodiment of FIG. 5 is substantially similar to the heat spreader precursor 24 described with reference to the embodiment of FIGS. 1-4.

Each lead 82 has an inner lead end and an opposing outer lead end. Formed on inner lead end is the bond site 62, which is electrically connected to the I/O pad 60 on the die 14. The outer lead end provides the land 68 for connecting to external circuitry. The leads 82 may have reduced thickness notch areas 84 disposed therein to ease singulation of the package precursors 12 by reducing the thickness of the substrate 16 that must be cut during singulation.

In the manufacture of the package strip 10 of FIG. 5, the heat spreader precursor 24 is placed over the dies 14 after the dies 14 have been attached to the die pads 80 and electrically connected to the leads 82 and before the molding compound 18 is applied. The molding compound 18 is advantageously applied to the strip 10 using a block mold. After the molding compound 18 is cured, the package strip 10 is then cut along lines 28, such as by blade saw, punch, laser, water jet, etc., to singulate the package precursors 12 into individual packages, one of which is shown generally at 86 in FIG. 6.

As shown in FIG. 6, each singulated package 86 includes a portion of the heat spreader precursor 24 (FIG. 5), which forms the heat spreader 20 for the package 86. The heat spreader 20 is at least partially embedded in the molding compound 18 and has a peripheral cut edge portion 32 aligned with and not recessed from associated peripheral cut edge portions 34 and 36 of the substrate 16 and molding compound 18, respectively. As in the previously-discussed embodiments, the heat spreader 20 enhances the thermal and advantageously electrical performance of the package 86. In addition, the heat spreader 20 shields the die 14 from electromagnetic forces acting on the package 86.

Figure 7A:
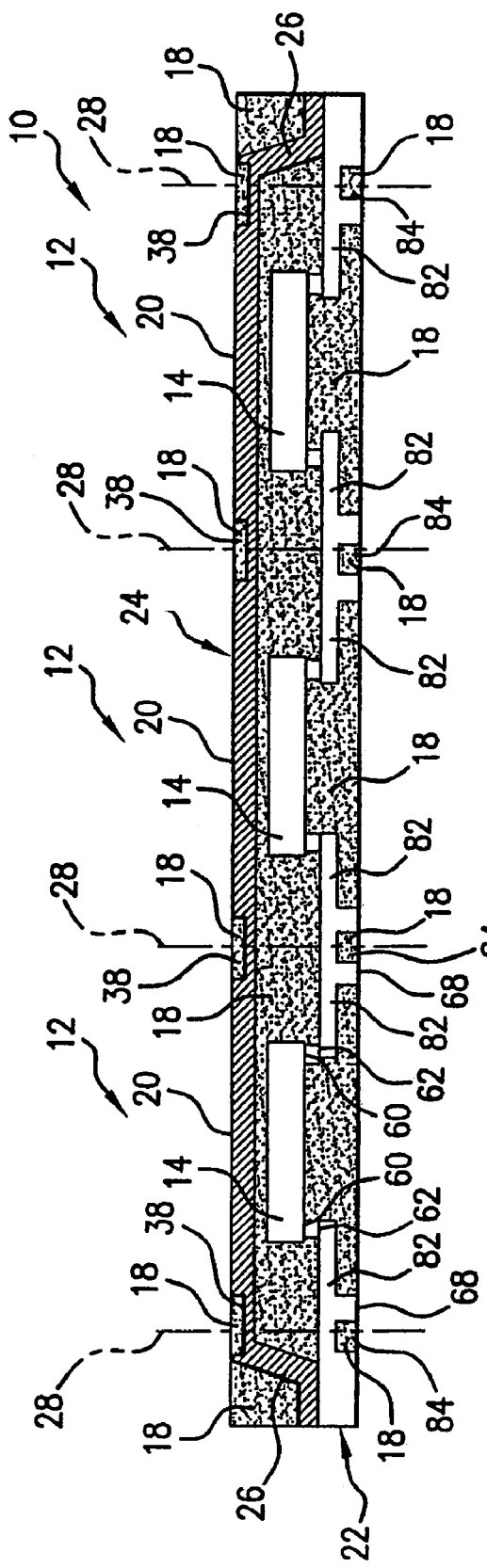
FIG. 7a is a cross-sectional elevation view of an alternative embodiment of a package strip having a lead frame substrate.

FIGS. 7a and 7b are each a cross-sectional elevation view of a package strip 10 having a lead frame type substrate 16 wherein the dies 14 are electrically connected to the substrate in flip-chip fashion. The package strip 10 is substantially similar to that shown in FIG. 5, with the exception being that the lead frame substrate 16 of FIGS. 7a and 7b does not include a die pad, and the leads 82 of FIGS. 7a and 7b extend beneath the die 14 for direct electrical connection with the I/O pads 60. As in the previous embodiments, the package strip 10 is cut along lines 28, such as by blade saw, punch, laser, water jet, etc., to singulate the package precursors 12 into individual packages. FIG. 7a depicts the package strip 10 wherein the dies 14 are separated from the heat spreader precursor 24 by the molding compound 18. FIG. 7b is identical to FIG. 7b, with the exception being that in the package strip 10 of FIG. 7b, the heat spreader precursor 24 is attached to each of the dies by a layer of material 88 having a higher thermal conductivity than that of the molding compound 18. For example, the layer of material 88 may be a layer of thermally conductive paste or a layer of metallic material disposed on the die 14.

Figure 8A:
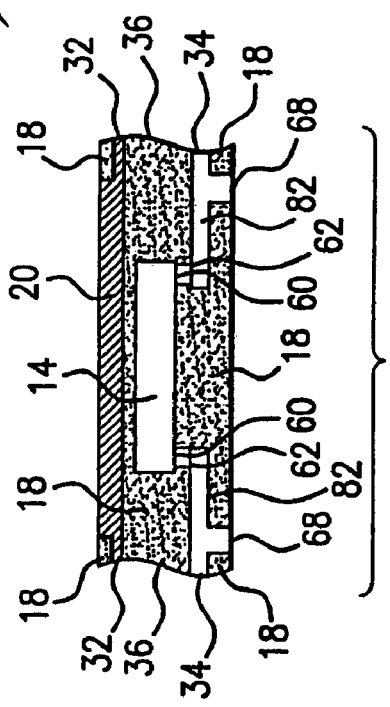

As shown in FIGS. 8a and 8b, each singulated package 90 includes a die 14 directly electrically connected to the leads 82. Each singulated package 90 also includes a portion of the heat spreader precursor 24 (FIGS. 7a and 7b), which forms the heat spreader 20 for the package 90. The heat spreader 20 is at least partially embedded in the molding compound 18 and has a peripheral cut edge portion 32 aligned with and not recessed from associated peripheral cut edge portions 34 and 36 of the substrate 16 and molding compound 18, respectively. As in the previously-discussed embodiments, the heat spreader 20 enhances the thermal and electrical performance of the package 90. In the embodiment of FIG. 8b, the layer of material 88 disposed between the die 14 and the heat spreader 20 further enhances the thermal performance of the package 90 by increasing the thermal conductivity between the die 14 and the heat spreader 20.

Figure 9:
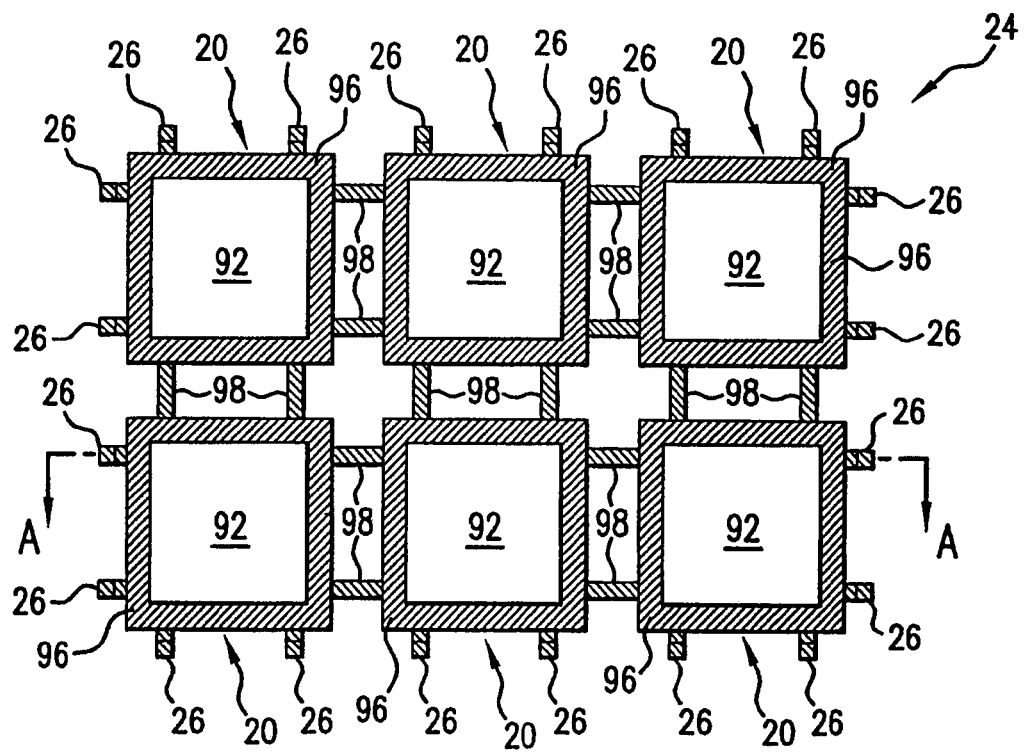
FIG. 9 is a plan view of an array of interconnected heat spreaders forming a heat spreader precursor.
Figure 10:
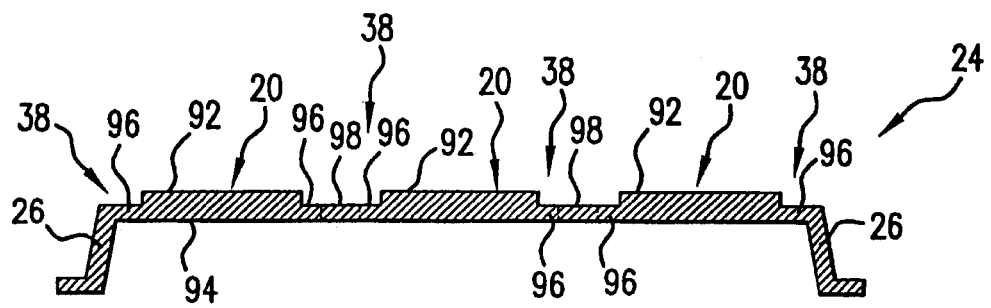
FIG. 10 is a cross-sectional elevation view of the array of interconnected heat spreaders taken along section A-A of FIG. 9.

Referring to FIGS. 9 and 10, the heat spreader precursor 24 for use in the embodiments of FIGS. 1, 2, and 5-8 is shown The heat spreader precursor 24 includes a plurality of interconnected heat spreaders 20, each of which includes a planar top surface 92, an opposing planar bottom surface 94, and a shoulder surface 96 extending around, and recessed from, the perimeter of the top surface 92. Each heat spreader 20 is interconnected to adjacent heat spreaders 20 by a pair of tie bars 98. As can be seen in the elevation view of FIG. 10, the tie bars 98 and shoulders 96 form the reduced thickness notch area 38. Disposed around the perimeter of the heat spreader precursor 24 are the legs 26. It will be appreciated that, although it is not shown, the heat spreader precursor for the embodiment of FIGS. 3 and 4 may be obtained from the heat spreader precursor 24 by shaping the tie bars 98 into legs 52, as depicted in FIGS. 3 and 4.

The heat spreader precursor 24 may be formed from a sheet of any material having a thermal conductivity greater than that of the molding compound 18. Preferably, the heat spreader precursor 24 is a metal such as, for example, copper, aluminum, or alloys containing one or more of copper and aluminum. Copper and copper base alloys are preferred, for example, where higher thermal conductivity is required, while aluminum or an aluminum base alloy is preferred where a lighter weight heat spreader is required. As defined herein, the term "alloy" refers to a mixture of two or more metals, or of one or more metals with certain nonmetallic elements, and the term "base" used in association with a metal refers to an alloy that contains at least 50 wt % of the specified element. Portions of each heat spreader 20, especially the top surface 92, which is exposed at the top of the package, may be plated with a metal such as nickel, to prevent oxidation. The heat spreader 20 may also be treated for anti-tarnishing and/or aesthetic properties using any convenient method, such as, for example, providing a black oxide coating on its surface.

The sheet of conductive material forming the heat spreader precursor 24 preferably has a thickness of between about 0.2 millimeters (mm) to about 0.5 mm, and more preferably between about 0.2 mm to about 0.3 mm. The features of the heat spreader precursor 24, including the tie bars 98 and legs 26, may be formed using any known method such as stamping, chemical etching, laser ablation, or the like. The legs 26 are preferably formed into down-set shape by bending. The reduced thickness notch areas 38 are preferably formed using a controlled subtractive process such as chemical etching or laser ablation. The reduced thickness notch areas 38 are preferably etched sufficiently to provide a shoulder 96 and tie bar 98 thickness of between about 25% to about 60% of the thickness of the heat spreader 20 (i.e., the thickness between the top and bottom surfaces 92, 94), and more preferably between about 50% to about 60% of this thickness. Thicknesses within this preferred range provide sufficient clearance in the reduced thickness notch area 38 to receive molding compound 18, which locks the heat spreader 20 in the package, and reduces a sufficient amount of the metal to ease singulation.

Figure 11:
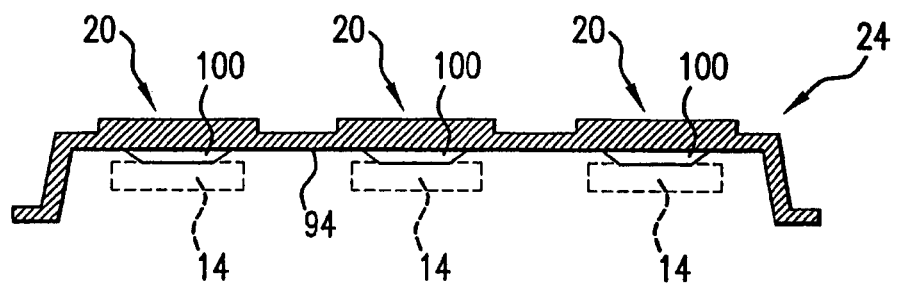
FIG. 11 is a cross-sectional elevation view of the array of interconnected heat spreaders taken along section A-A of FIG. 9 including a die contact protrusion.

Referring to FIG. 11, an alternative embodiment of the heat spreader precursor 24 is shown wherein each heat spreader 20 includes a protrusion 100 extending from the bottom surface 94. Each protrusion 100 contacts an associated die 14 when the heat spreader 20 is installed in the package, thus allowing heat from the die 14 to be directly conducted to the heat spreader 20. The heat spreader may be attached to the die using epoxy, adhesive, or the like. It will be appreciated that the heat spreader having the protrusion may be used in any of the embodiments of FIGS. 1-8.

Figure 12:
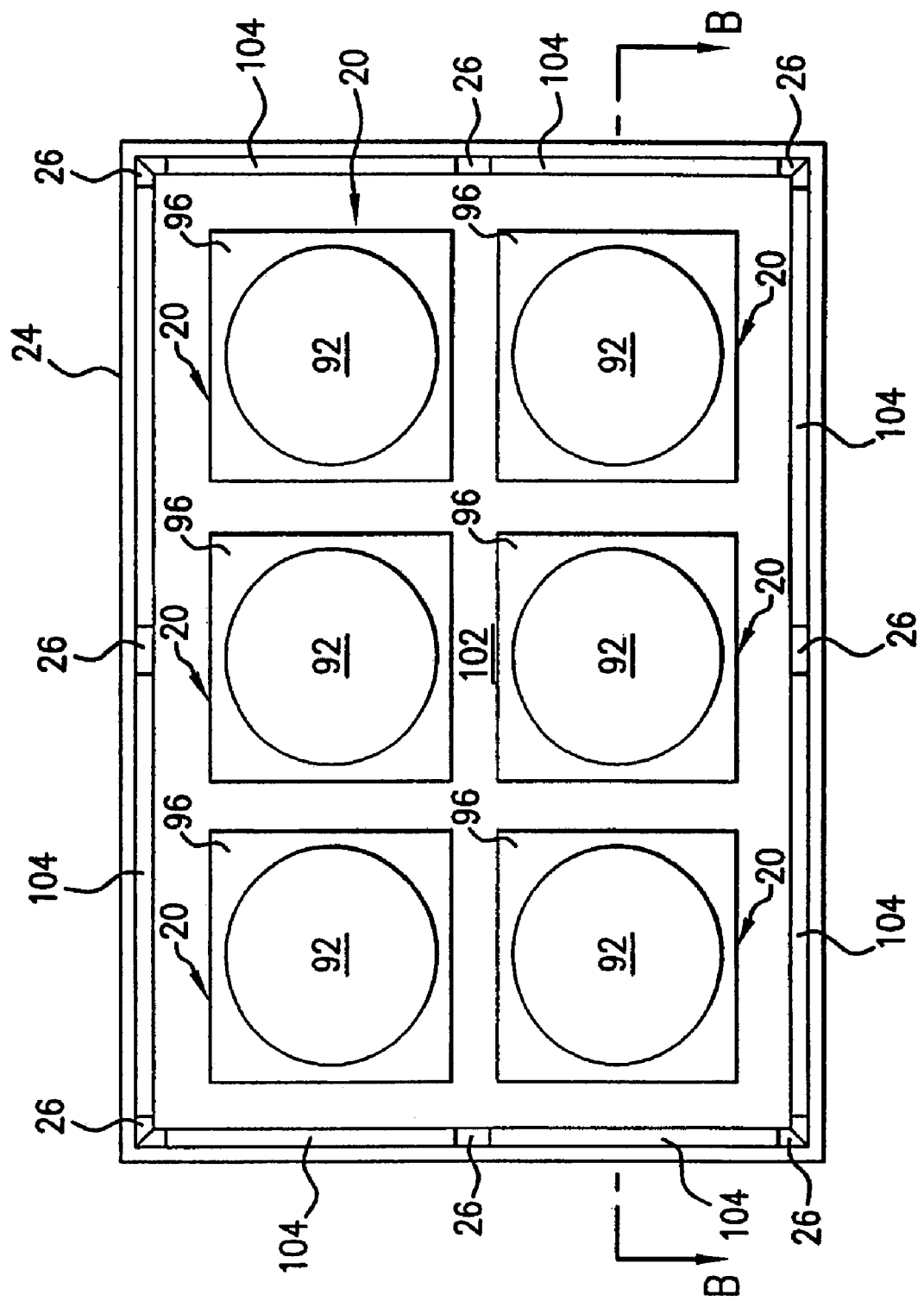
FIG. 12 is a plan view of an alternative embodiment of the array of interconnected heat spreaders forming a heat spreader precursor.

Referring to FIGS. 12 and 13, another alternative embodiment of the heat spreader precursor 24 is shown. In the embodiment of FIG. 12, the heat spreader precursor 24 includes a plurality of interconnected heat spreaders 20, each of which includes a planar top surface 92, an opposing planar bottom surface 94, and a shoulder surface 96 extending around, and recessed from, the perimeter of the top surface 92. Each heat spreader 20 is interconnected to adjacent heat spreaders 20 by a recessed planar portion 102. As can be seen in the elevation view of FIG. 13, the recessed planar portion 102 forms the portion of the reduced thickness notch area 38 that is cut during singulation. Disposed around the perimeter of the heat spreader precursor 24 are the legs 26, and disposed through portions of the legs 26 is a plurality of through holes 104, which allow the ingress of molding compound 18.

The sheet of conductive material forming the heat spreader precursor 24 of FIGS. 12 and 13 preferably has a thickness of between about 0.2 mm to about 0.5 mm, and more preferably between about 0.2 mm to about 0.3 mm. The features of the heat spreader precursor 24, such as the legs 26 and through holes 104, may be formed using any known method such as stamping, chemical etching, laser ablation, or the like. The legs 26 may be formed into shape by bending. The shoulder areas 26 are preferably etched to provide a thickness of between about 25% to about 60% of the thickness of the heat spreader 20 (i.e., the thickness between the top and bottom surfaces 92, 94), and more preferably between about 50% to about 60% of this thickness. Thicknesses within this preferred range provide sufficient clearance in the reduced thickness notch area 38 to receive molding compound 18, which locks the heat spreader 20 in the package, and reduces a sufficient amount of the metal to ease singulation. The heat spreader precursor 24 of FIGS. 12 and 13 may also include protrusions 100 for contacting the dies 14, as shown in FIG. 14.

Figure 15:
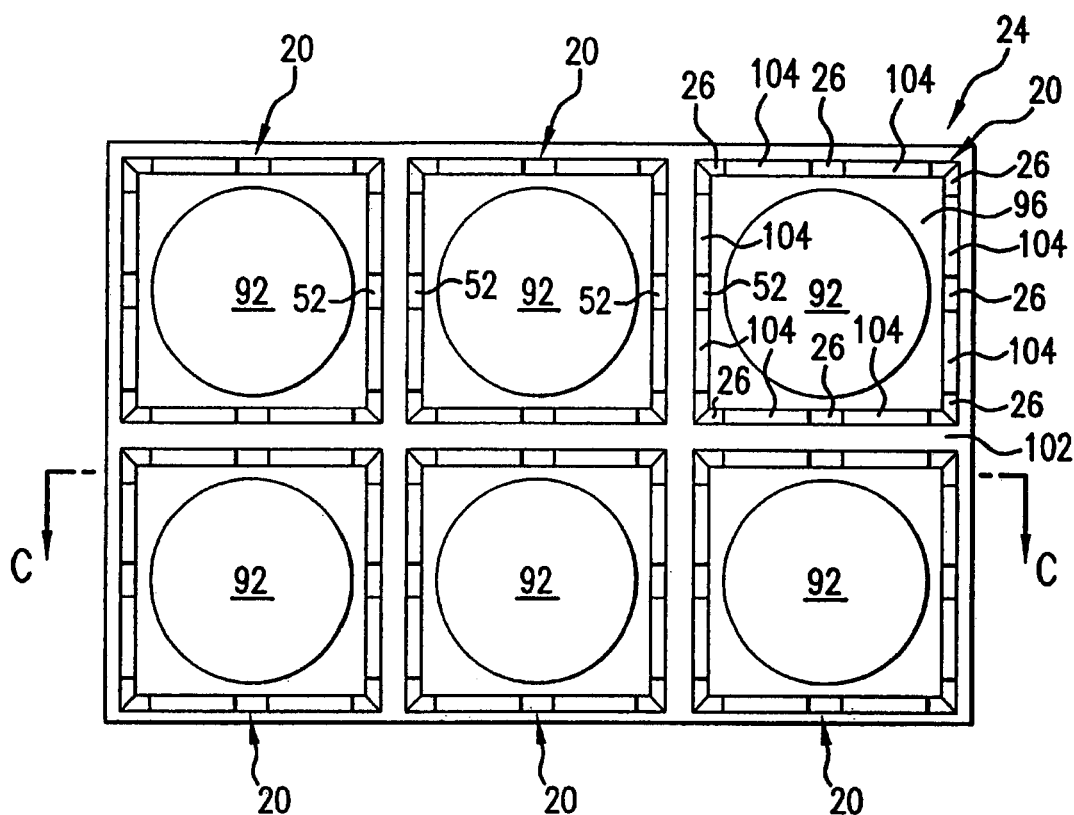
FIG. 15 is a plan view of an alternative embodiment of the array of interconnected heat spreaders forming a heat spreader precursor.
Figure 16:
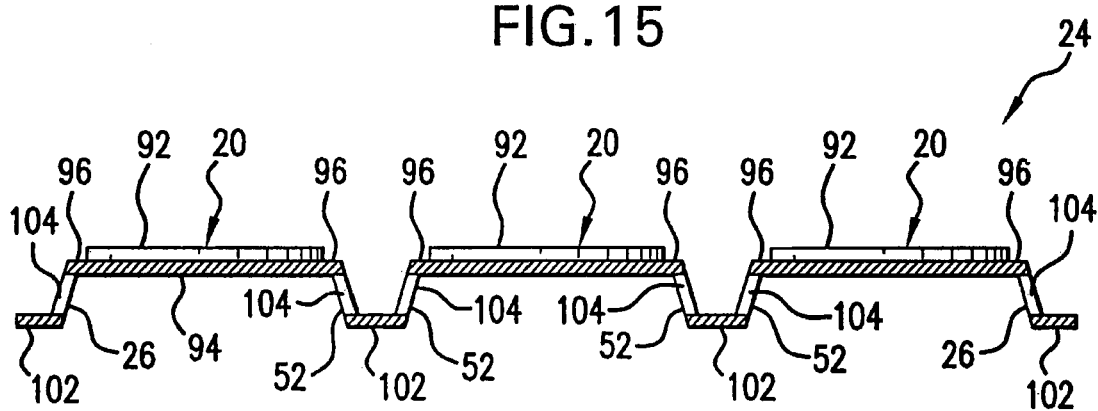
FIG. 16 is a cross-sectional elevation view of the array of interconnected heat spreaders taken along section C-C of FIG. 15.

Referring to FIGS. 15 and 16, another alternative embodiment of the heat spreader precursor 24 is shown. In the embodiment of FIG. 15, the heat spreader precursor 24 includes a plurality of interconnected heat spreaders 20, each of which includes a planar top surface 92, an opposing planar bottom surface 94, and a shoulder surface 96 extending around, and recessed from, the perimeter of the top surface 92. Each heat spreader 20 is interconnected to adjacent heat spreaders 20 by a recessed planar portion 102. As can be seen in the elevation view of FIG. 16, the embodiment of FIGS. 15 and 16 corresponds to the heat spreader precursor 24 of FIG. 3, wherein the heat spreader precursor 24 includes down-set legs 52 positioned between each of the package precursors 12 in addition to the legs 26 disposed at the perimeter of the heat spreader precursor 24. The recessed planar portion 102 forms the bottom portions of the legs 52, which are cut during singulation. Disposed through portions of the legs 26 and 52 is a plurality of through holes 104, which allow the ingress of molding compound 18. The number and position of the through holes 104 may be changed from that depicted in FIGS. 15 and 16 to provide different patterns of legs 26 and 52, as may be necessary if the heat spreader 20 is to be electrically connected to the substrate 16, as described with reference to FIGS. 3 and 4.

Figure 17:
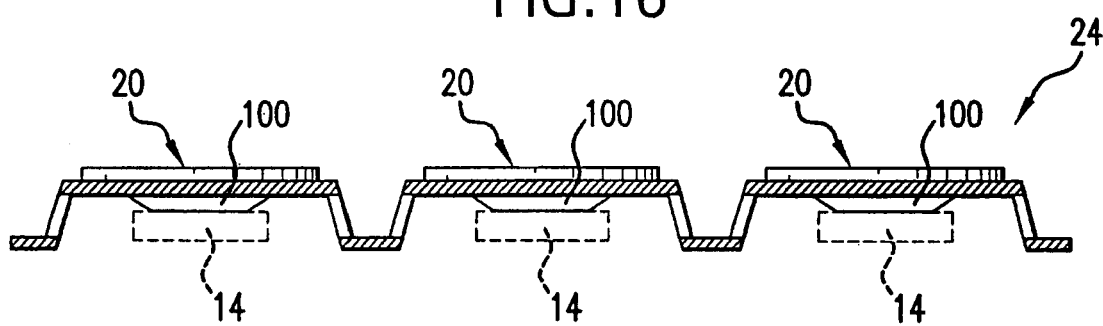
FIG. 17 is a cross-sectional elevation view of the array of interconnected heat spreaders taken along section C-C of FIG. 15 including a die contact protrusion.

The sheet of conductive material forming the heat spreader precursor 24 of FIGS. 15 and 16 preferably has a thickness of between about 0.2 mm to about 0.5 mm, and more preferably between about 0.2 mm to about 0.3 mm. The features of the heat spreader precursor 24, such as the through holes 104, may be formed using any known method such as stamping, chemical etching, laser ablation, or the like. The legs 26 and 52 may be formed into shape by bending. The shoulder areas 26 are preferably etched to provide a thickness of between about 25% to about 60% of the thickness of the heat spreader 20 (i.e., the thickness between the top and bottom surfaces 92, 94), and more preferably between about 50% to about 60% of this thickness. The heat spreader precursor 24 of FIGS. 15 and 16 may also include protrusions 100 for contacting the dies 14, as shown in FIG. 17.

In each of the embodiments described above, the package strip 10 and its associated heat spreader precursor 24 and substrate strip 22 are depicted as having an array or matrix of three interconnected package precursors 12. It will be appreciated, however, that the present invention is applicable to any package strip 10 having two or more interconnected package precursors 12 are assembled in array or matrix fashion. For example, FIGS. 18 and 19 depict a package strip 10 configured for assembly 2×2 matrix of interconnected package precursors.

Figure 18:
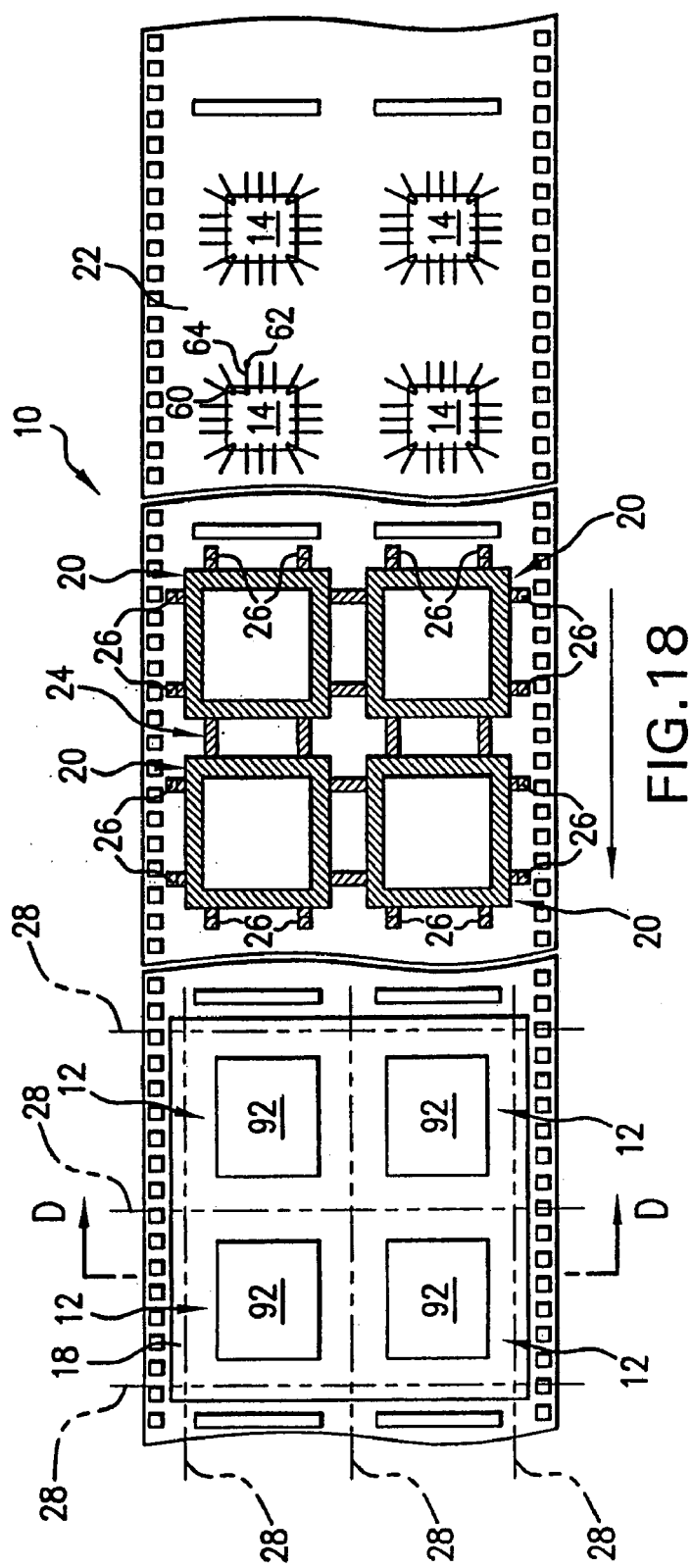
FIG. 18 is a plan view of a package strip of the present invention in various stages of manufacture.
Figure 19:
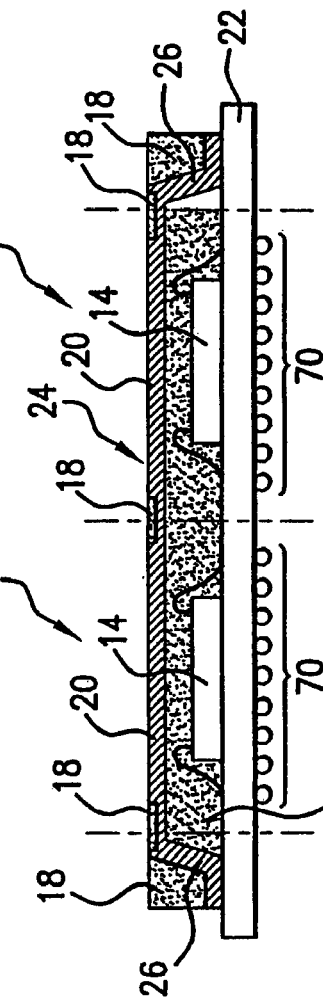
FIG. 19 is a cross-sectional elevation view of the package strip taken along section D-D of FIG. 18.
Figure 20:
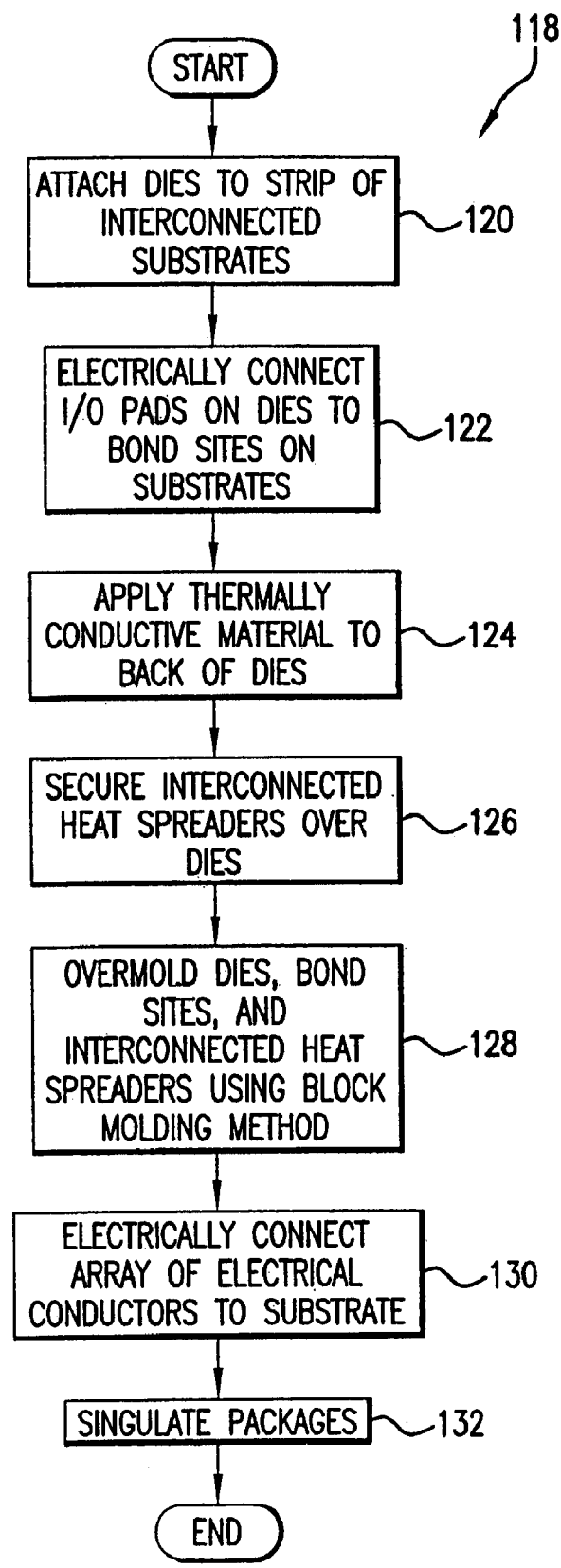
FIG. 20 is a flow chart depicting a method for manufacturing a molded plastic package.

FIG. 18 is a plan view of an example of a package strip 10 of the present invention in various stages of manufacture. FIG. 19 is a cross-sectional elevation view of the package strip 10 of FIG. 18, and FIG. 20 is a flow chart depicting a method 118 for manufacturing a molded plastic package, which may be used to manufacture any of the embodiments described herein. In the method 118, each die 14 is secured to the substrate strip 22 using any convenient method, such as solder, epoxy, double sided adhesive tape, and the like (block 120 of method 118). After the dies 14 are secured to the substrate strip 22, wires 64 are individually connected between the I/O pads 60 on the dies 14 and the bond sites 62 on the substrate strip 22 (block 122). Alternatively, where the I/O pads 60 are to be electrically connected to the bond sites 62 using a flip-chip method, steps 120 and 122 are performed simultaneously, with the electrical connection between each die 14 and the substrate strip 22 also serving to mechanically attach the die 14 on the substrate.

After the dies 14 have been electrically connected to the substrate strip 22, thermally conductive material 88 (FIG. 7b) maybe applied to the back of the dies if it is desired to have the heat spreaders 20 connected to the die 14 in each package (block 124). The heat spreader precursor 24 is then disposed over the dies 14 with each heat spreader 20 in the heat spreader precursor 24 aligned above its respective die 14, and the legs 26 on the heat spreader precursor 24 are coupled to the substrate strip 22 using solder, epoxy, double sided adhesive tape, and the like (block 126).

With the heat spreader precursor 24 in position, the package precursors 12 are coated with molding compound 18 using a block molding method (block 128). That is, a continuous coating of molding compound 18 overmolds each package precursor 12 in the matrix of the package precursors 12. As shown in FIG. 18, the top surface 92 of each heat spreader 20 remains exposed from the molding compound 18. After the molding compound 18 has been cured, the array of electrical conductors 70 (e.g., solder balls, solder bumps, solder paste, pins, etc.) may be attached to the substrate strip (block 130). The package precursors 12 are then singulated along lines 28 using any convenient method, such as, for example, saw, punch, laser, or water jet, to provide individual packages (block 132). It will be appreciated that method 118 may include various inspection steps, curing steps, cleaning steps, or other steps as may be necessary for a particular package design.

Method 118 provides for the automated manufacture of thermal enhanced molded plastic packages while eliminating some of the complex manufacturing steps associated with methods of the prior art. For example, method 118 allows the use of a block molding technique for molding the packages in the package strip. As a result, the present invention eliminates the problems associated with individual molding techniques used in the manufacture of thermally enhanced molded plastic packages of the prior art. In addition, because the heat spreader precursor 24 of the present invention does not need to be attached to the substrate within each individual package, the present invention eliminates the need to secure the heat spreader to the substrates within the individual package precursors using a dielectric adhesive, as is necessary in methods of the prior art.

A number of embodiments of the present invention have been described. Nevertheless, it will be understood that various modifications may be made without departing from the spirit and scope of the invention. Accordingly, other embodiments are within the scope of the following claims.

The invention claimed is:

1. A device comprising:
    a substrate (16) having first and second generally opposite surfaces, the substrate (16) first surface having a plurality of bond sites (62) disposed thereon;
    a die (14) mounted to first surface of the substrate (16), the die (14) having first and second generally opposite surfaces parallel to the substrate (16) first and second surfaces, the die (14) first surface having a plurality of I/O pads (60) disposed thereon, the I/O pads (60) being electrically connected to the bond sites (62);
    a molding compound (18) encapsulating the die (14) and at least the first surface of the substrate (16); and
    a heat spreader (20) at least partially embedded in the molding compound (18) and having a peripheral cut edge portion (32) aligned with and not recessed from associated peripheral cut edge portions (34, 36) of the substrate (16) and molding compound (18).

2. The device of claim 1, wherein the heat spreader (20) has first and second generally opposite surfaces parallel to the die (14) first and second surfaces, the heat spreader (20) second surface being covered by the molding compound (18) and the heat spreader (20) first surface being uncovered by the molding compound (18).

3. The device of claim 2, wherein the heat spreader (20) is thermally connected to the die by a material (88) having a thermal conductivity higher than a thermal conductivity of the molding compound (18).

4. The device of claim 2, wherein the heat spreader (20) includes a protrusion (100) extending from the heat spreader (20) second surface, the protrusion contacting the die (14).

5. The device of claim 1, wherein the heat spreader (20) includes a down-set leg (52) contacting the substrate (16) first surface.

6. The device of claim 5, wherein the heat spreader (20) is electrically connected to the substrate (16).

7. The device of claim 1, wherein the heat spreader (20) is entirely separated from the substrate (16).

8. The device of claim 1, wherein the heat spreader (20) includes through holes (104) disposed therein for the ingress of the molding compound (18) between the heat spreader (20) and the substrate (16).

9. The device of claim 1, wherein the substrate (16) is a metallic lead frame.

10. The device of claim 1, wherein the substrate (16) comprises a dielectric material (66) having first electrical conductors (72) disposed thereon, the first electrical conductors (72) being selected from at least one of electrically conductive traces, layers, vias, pins, and combinations including one or more of the foregoing.

11. A device comprising:
    a substrate (16) having first and second generally opposite surfaces, the substrate (16) first surface having a plurality of bond sites (62) disposed thereon, wherein the substrate (16) comprises a dielectric material (66) having;
        first electrical conductors (72) disposed thereon, the first electrical conductors (72) being selected from at least one of electrically conductive traces, layers, vias, pins, and combinations including one or more of the foregoing; and
        an array of second electrical conductors (70) electrically coupling the substrate (16) to an external circuit, the second electrical conductors (70) being selected from at least one of solder balls, solder bumps, solder paste, pins, and combinations including one or more of the foregoing;
    a die (14) mounted to first surface of the substrate (16), the die (14) having first and second generally opposite surfaces parallel to the substrate (16) first and second surfaces, the die (14) first surface having a plurality of I/O pads (60) disposed thereon, the I/O pads (60) being electrically connected to the bond sites (62);
    a molding compound (18) encapsulating the die (14) and at least the first surface of the substrate (16); and
    a heat spreader (20) at least partially embedded in the molding compound (18) and having a peripheral cut edge portion (32) aligned with and not recessed from associated peripheral cut edge portions (34, 36) of the substrate (16) and molding compound (18).

12. The device of claim 1, further comprising:
    a plurality of wires (64) or conductive tape strips, each being electrically connected between an I/O pad (60) on the die (14) first surface and a bond site (62) on the substrate (16) first surface.

13. The device of claim 1, wherein each of the I/O pads (60) on the die (14) is directly electrically connected to a bond site (62) on the substrate (16) in flip-chip fashion.

* * * * *